(12) United States Patent
Zatelli

(10) Patent No.: US 6,381,173 B1
(45) Date of Patent: Apr. 30, 2002

(54) SERIAL-FLASH, EPROM, EEPROM AND FLASH EEPROM NONVOLATILE MEMORY IN AMG CONFIGURATION

(75) Inventor: Nicola Zatelli, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/686,362

(22) Filed: Oct. 10, 2000

(30) Foreign Application Priority Data

Oct. 24, 1999 (IT) .......................................... TO99A0884

(51) Int. Cl.[7] .............................................. G11C 16/00

(52) U.S. Cl. .............................. 365/185.05; 365/185.23

(58) Field of Search ........................ 365/185.05, 185.23, 365/52, 63

(56) References Cited

U.S. PATENT DOCUMENTS 6,128,219 A * 10/2000 Pio et al. ................ 365/185.05
6,128,220 A * 10/2000 Banyai ................... 365/185.05

* cited by examiner

*Primary Examiner*—Tan T. Nguyen
(74) *Attorney, Agent, or Firm*—Lisa K. Jorgenson; Robert Iannucci; Seed IP Law Group, PLLC

(57) ABSTRACT

A serial-flash, EPROM, EEPROM, or flash EEPROM nonvolatile memory in AMG configuration includes a byte enable transistor having an input terminal, connected to a control gate line and receives an input voltage, an output terminal, connected to at least one memory cell and supplying an output voltage, a control terminal connected to a word line, and a bulk region housing conductive regions connected to the input and output terminals. The byte enable transistor is a P-channel MOS transistor, the bulk region whereof is biased to a bulk voltage that is not lower than the input voltage.

18 Claims, 3 Drawing Sheets

SERIAL-FLASH, EPROM, EEPROM AND FLASH EEPROM NONVOLATILE MEMORY IN AMG CONFIGURATION

TECHNICAL FIELD

The present invention relates to a serial-flash, EPROM, EEPROM and flash EEPROM nonvolatile memory in AMG (Alternate Metal Ground) configuration.

BACKGROUND OF THE INVENTION

As is known, floating gate EEPROM memory cells are programmed (written and/or erased) by Fowler-Nordheim effect, by injecting or extracting charges, through a thin tunnel oxide region, by applying appropriate voltages between the terminals of the cells. In particular, it is necessary to supply high voltages to control terminals of cells to be programmed, which are selected by enable transistors.

For greater clarity, reference is made to FIG. 1, which shows an example of a known architecture of an EEPROM memory array 1, belonging to a memory device 15. The memory array 1 comprises a plurality of cells 2, arranged on rows and columns, and each comprises a sense transistor 3 and a select transistor 4. The cells 2 are connected to one another in groups, to form memory bytes, comprising each for example eight cells 2. FIG. 1 shows two cells 2 belonging to a single byte.

In detail, the control gate terminals of the sense transistors 3 that belong to a single byte are connected by a gate line 5 to a source terminal of a respective byte enable transistor 6. In addition, the sense transistors 3 have source terminals connected to a common source line 8, which can be alternatively grounded or left floating by a selector 13, and drain terminals, each of which is connected to a source terminal of a respective select transistor 4.

The drain terminals of the select transistors 4 are each connected to a respective bit line 10. FIG. 1 shows two bit lines 10 that belong to the same byte, and are designated respectively as BLO and BL7. The select transistors 4 of cells 2 which belong to a single array row also have gate terminals which are connected to a word line 11.

The byte enable transistor 6, which comprises an N-channel MOS transistor, has a gate terminal connected to the word line 11, and a drain terminal connected to a control gate line 12.

The known devices have some disadvantages. In particular, during erasing of the cells 2, the control gate line 12, via the byte enable transistor 6, must feed the control gate terminals of the cells 2 to be erased with high voltages, for example 14 V. However, a voltage drop exists between the drain and source terminals of the byte enable transistor 6 and thus the control gate line 12 must be set to a voltage higher than that required for erasing.

In addition, the byte enable transistor 6 has a high threshold voltage, since it is N-channel, and, as shown in FIG. 2, it is formed directly in a P-type substrate region 20 of the memory device 15. In detail, the byte enable transistor 6 comprises a source region 21 and a drain region 22, both of $N^+$ type, embedded in the substrate region 20, and defining a channel region 23. In addition, the substrate region 20 defines a bulk region. Normally, the substrate region 20 is at a voltage close to 0 V, and thus, during erasing, high voltages are established between the source region 21 and the bulk of the byte enable transistor 6.

It is known that the threshold voltage of MOS transistors increases as the bulk-source voltage increases (so-called body effect). Consequently, because of this high voltage, there is a considerable increase in the threshold voltage of the byte enable transistor 6, and the latter can transfer to the source terminal a reduced portion of the voltage that is present at the drain terminal. Therefore, it is necessary to generate and feed the drain terminal of the byte enable transistor 6 with a voltage that is considerably higher than the voltage that must be applied to the control gate terminals of the cells 2. This requires pumping circuits of an appropriate size, as well as involving higher energy consumption. In addition, it is necessary to provide specific processing phases to produce high voltage components, with high breakdown voltage.

SUMMARY OF THE INVENTION

An embodiment of the present invention provides a non-volatile memory that is free from the disadvantages described, and in particular reduces the body effect on the byte enable transistors, includes a byte enable transistor having an input terminal, connected to a control gate line and receives an input voltage, an output terminal, connected to at least one memory cell and supplying an output voltage, a control terminal connected to a word line, and a bulk region housing conductive regions connected to the input and output terminals. The byte enable transistor is a P-channel MOS transistor, the bulk region whereof is biased to a bulk voltage that is not lower than the input voltage.

BRIEF DESCRIPTION OF THE DRAWINGS

For a better understanding of the invention, an embodiment is now described, purely by way of non-limiting example, and with reference to the attached drawings, wherein.

DETAILED DESCRIPTION OF THE INVENTION

Figure 1:
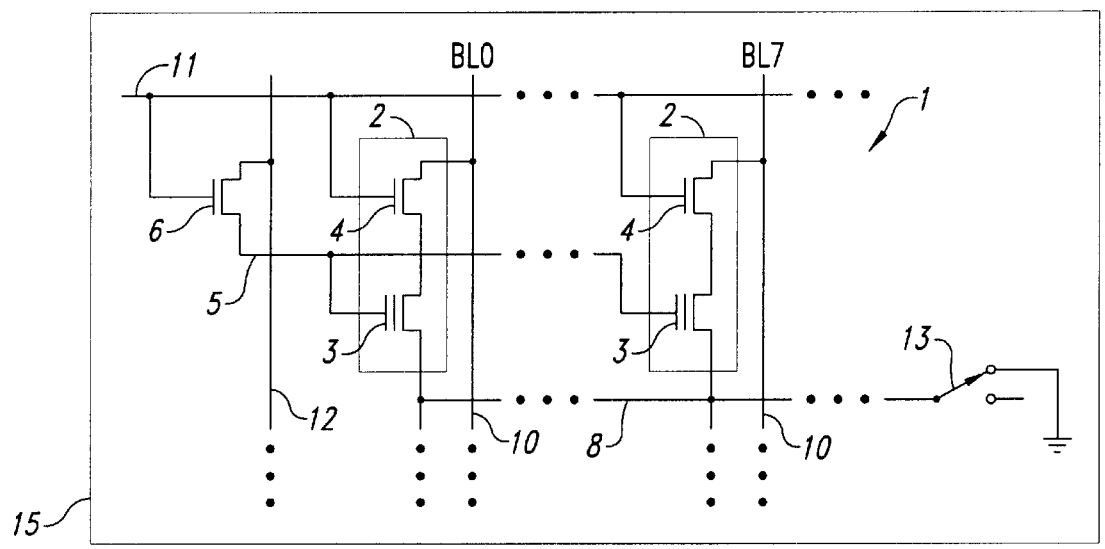
FIG. 1 illustrates a simplified circuit diagram of a non-volatile memory of known type.
Figure 2:
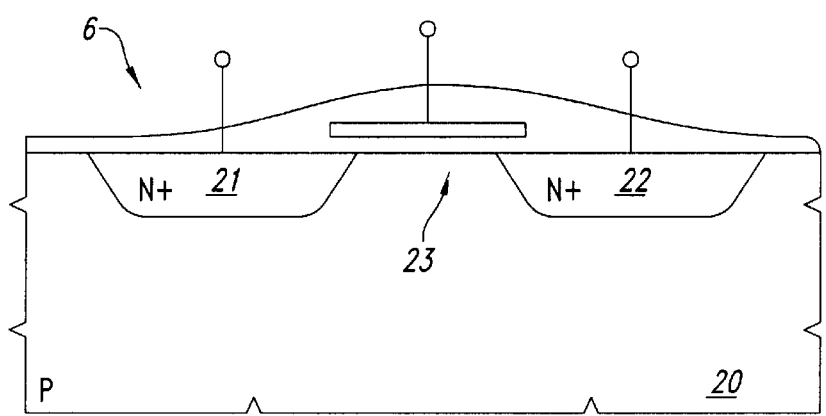
FIG. 2 shows a cross-section of a component used in the memory in FIG. 1.
Figure 3:
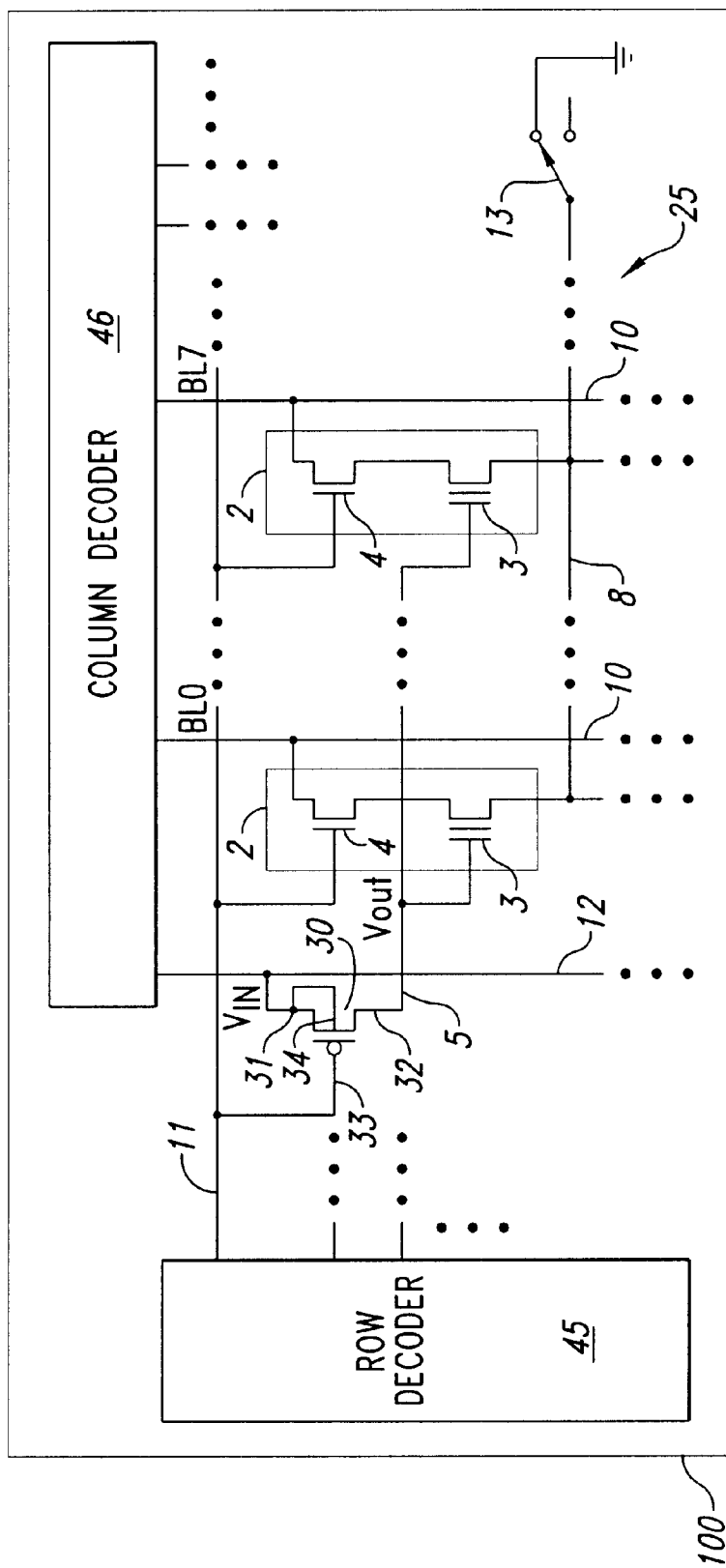
FIG. 3 illustrates a simplified circuit diagram of a non-volatile memory according to the present invention.

FIG. 3, in which parts equal to those illustrated in FIG. 1 are indicated by the same reference numbers, shows an EEPROM memory array 25 that belongs to a nonvolatile memory 100 according to an embodiment the present invention.

In detail, the memory array 25 comprises a plurality of cells 2 arranged on rows and columns, each of which comprises a sense transistor 3 and a select transistor 4, and is connected to form memory bytes. The bytes can be selected by a row decoder 45 and a column decoder 46, to which they are connected respectively via word lines 11 and control gate lines 12, as illustrated in detail hereinafter.

In FIG. 1, the sense transistors 3 have control gate terminals connected to a gate line 5; source terminals connected to a common source line 8, and drain terminals, each connected to a source terminal of a respective select transistor 4. The drain terminals of the select transistors 4 are each connected to a respective bit line 10, and the gate terminals are connected to a word line 11.

The memory 100 differs from the memory 15 in FIG. 1 in that the byte enable transistor, here indicated at 30, is of P-channel type, and has a source terminal 31 (defining an input terminal) connected to the control gate line 12, a drain terminal 32 (defining an output terminal) connected to the gate line 5, and a gate terminal 33 (defining a control terminal) connected to the word line 11. In detail, the source terminal 31 receives an input voltage $V_{IN}$ via the control gate line 12, and the drain terminal 32 supplies an output voltage $V_{OUT}$ to the gate line 5. In addition, the byte enable transistor 30 has a bulk terminal 34 connected to the source terminal 31.

Figure 4:
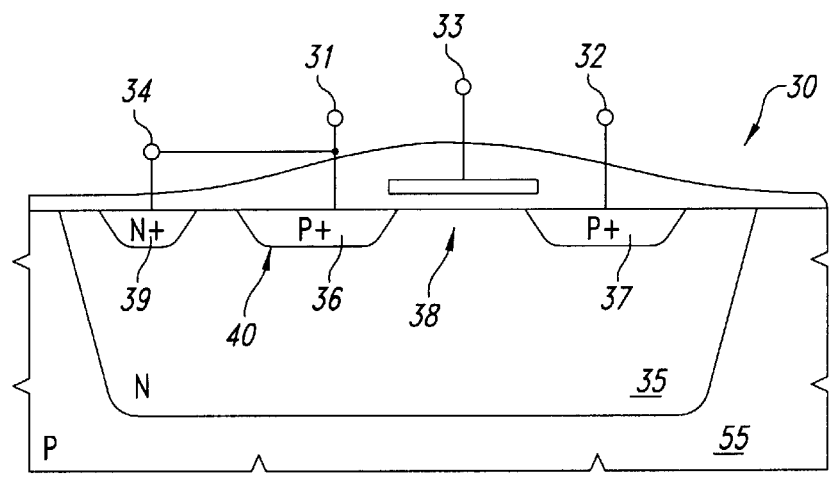
FIG. 4 shows a cross-section of a component used in the memory in FIG. 3.

In particular, as shown in detail in FIG. 4, the byte enable transistor 30 comprises an N-type well 35, embedded in a substrate region 55. Inside the well 35, forming the bulk of the byte enable transistor 30, there are a source region 36 and a drain region 37, both of $P^+$-type, which are spaced from each other and delimit between them a channel region 38; in addition, a bulk polarization region 39 of $N^+$-type is formed inside the well 35. The source terminal 31 and the bulk terminal 34 are connected respectively to the source region 36 and bulk bias region 38, and to each other. Thereby, the source voltage of the source region 36 and the bulk voltage of the well 35 have the same value as the input voltage $V_{IN}$. Therefore the PN junction (indicated as 40 in FIG. 4) formed by the source region 36 and the well 35, is prevented from being directly biased, when a positive voltage is supplied to the source terminal 31.

During erasing, when the cells 2 (FIG. 3) are selected, the control gate line 12 is set to an erase voltage, the value of which can be, for example, between approximately 7 and 15 V, according to the type of memory and process used, and the word line 11 is set to a higher voltage than the erase voltage. Consequently, an input voltage $V_{IN}$ which has the same value as the erase voltage is supplied to the source and bulk terminals 31, 34, which are connected to the control gate line 12 and to each other. Thereby, the source region 36, the bulk bias region 39 and the well 35 are biased to the same input voltage $V_{IN}$. Since the bulk-source voltage is zero, the body effect is theoretically zero, and the input voltage $V_{IN}$ is transferred to the output of the drain terminal 32, and thus to the gate line 5 and to the gate terminals of the cells 2 to be erased. When an appropriate voltage is supplied to the gate terminal of the byte enable transistor 30, the drain-source voltage drop can become very low (for example 0.2 V), and the output voltage $V_{OUT}$ is substantially the same as the input voltage $V_{IN}$. Consequently, the gate terminals of the cells 2 to be erased are set to a voltage that is close to the erase voltage present on the control gate line 12.

The advantages of the present invention are apparent from the foregoing description. In fact, the use of a byte enable transistor of the type described allows the control gate lines to be supplied with a voltage having a value close to that required by the control gate terminals of the cells 2, thus it is no longer necessary to generate voltages that are far higher than the operative voltages normally used.

In addition, since the various regions which form the byte enable transistor 30 are all at virtually the same voltage, there are no high-voltage junctions, and it is therefore not necessary for the transistor to be manufactured as a high voltage component having high breakdown voltage. This is a financial advantage, since the manufacture of the byte enable transistor 30 does not require specific process steps.

Finally, it is apparent that modifications and variants can be made to the memory described, without departing from the scope of the present invention.

In particular, it is not essential to bias the well 35 to the same voltage as the source region 36, although this is particularly advantageous; in fact, it is sufficient to prevent the PN junction 40 from being directly biased, and to prevent the increase of threshold voltage caused by body effect. Therefore, instead of being connected to the source terminal 31, the bulk terminal 34 can be connected to a different supply source, for example greater than or equal to the erase voltage.

Figure 5:
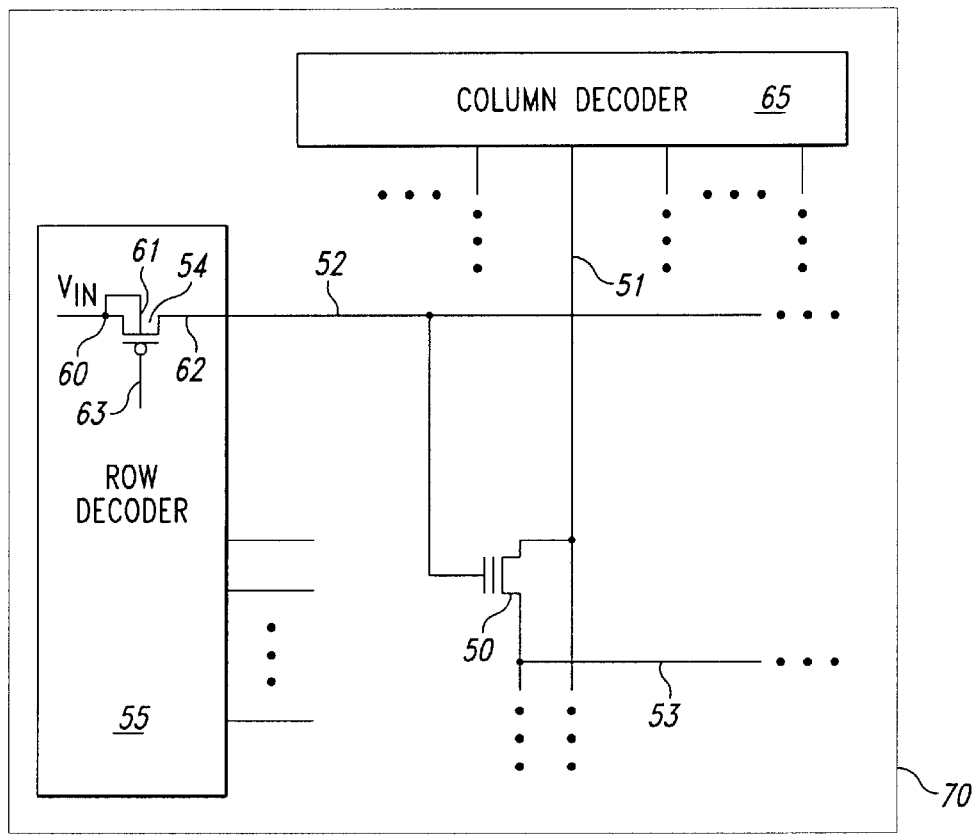
FIG. 5 illustrates a simplified circuit diagram similar to that in FIG. 3, for a different type of memory.

The present solution can be applied to all non-volatile memories that include N-channel byte enable transistors, as required at least in some operative conditions of the memory, for example during erasing, to transfer high voltages, and subject to the body effect. For example, FIG. 5 shows a flash or EPROM cell 50 of a memory 70, having a drain terminal connected to a bit line 51, a gate terminal connected to a word line 52, and a source terminal connected to a source line 53. The bit line 51 is selected by a column decoder 65; the word line 52 is selected by a row decoder 55. In detail, the word line 52 is connected to the drain terminal 62 of a PMOS transistor, which hereinafter, for consistency with FIG. 3, is called enable transistor 54. The enable transistor 54 has source terminal 60 receiving the input voltage $V_{IN}$ and connected to the bulk terminal 61 and gate terminal 63 receiving from the line decoder 55 a control signal of an appropriate value, as will be apparent to persons skilled in the art.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A non-volatile memory in AMG configuration, comprising a byte enable transistor having an input terminal receiving a first voltage, an output terminal supplying a second voltage, a control terminal, and a bulk region accommodating conductive regions connected to said input and output terminals, wherein said byte enable transistor is a p-channel MOS transistor, and said bulk region is biased to a third voltage not lower than said first voltage.

2. A memory according to claim 1 wherein said third voltage has a same value as said first voltage.

3. A memory according to claim 1 wherein at least in one operative condition of said memory, said first voltage is between 7 V and 15 V.

4. A memory according to claim 1 wherein said first terminal is a source terminal, said second terminal is a drain terminal and said control terminal is a gate terminal.

5. A memory according to claim 1, further comprising a plurality of memory cells, at least one word line and a control gate line, wherein said input terminal is connected to said control gate line, said output terminal is connected to at least one of said memory cells, and said control terminal is connected to said word line.

6. A memory according to claim 1 wherein said byte enable transistor is formed in a substrate of p-type semiconductor material, accommodating a well defining said bulk region; said well accommodating a first and a second conductive regions, which are spaced from each other and delimit between them a channel region formed by said well.

7. A memory according to claim 6 wherein said first conductive region is connected to said first terminal, said second conductive region is connected to said second terminal and said well is electrically connected to said first conductive region.

8. A nonvolatile memory, comprising:
- a first memory cell having a control terminal and first and second conduction terminals, the first conduction terminal being coupled to a first bit line; and
- an enable transistor having a first conductive region coupled to a first voltage reference, a second conductive region coupled to the control terminal of the memory cell, a control terminal, and a bulk region accommodating the first and second conductive regions, the bulk region being biased to a voltage not lower than the first voltage reference.

9. The nonvolatile memory of claim 8 wherein the bulk region is electrically coupled to the first conductive region.

10. The nonvolatile memory of claim 8 wherein the enable transistor is a P-channel transistor.

11. The nonvolatile memory of claim 8 wherein the bulk region is a well of a first conductivity type positioned in a substrate of a second conductivity type and the first and second conduction regions are positioned in the well and are of the second conductivity type.

12. The nonvolatile memory of claim 11, further comprising a bulk polarization region positioned within the bulk region and spaced from the first and second conduction regions.

13. The nonvolatile memory of claim 12 wherein the bulk polarization region and the first conduction region are tied together to the first voltage reference.

14. The nonvolatile memory of claim 8 wherein the first memory cell includes:
- a sense transistor having a control terminal coupled to the second conduction terminal of the enable transistor, and first and second conduction terminals; and
- a select transistor having a control terminal coupled to the control terminal of the enable transistor, a first conduction terminal coupled to the first bit line, and a second conduction terminal coupled to the first conduction terminal of the sense transistor.

15. The nonvolatile memory of claim 8, further comprising a second memory cell having a control terminal coupled to the second conduction terminal of the enable transistor, a first conduction terminal coupled to a second bit line, and a second conduction terminal coupled to the second conduction terminal of the first memory cell.

16. A method of operating a memory that includes a memory cell and an enable transistor, the enable transistor having control, bulk, first conduction, and second conduction terminals and the memory cell having a control terminal coupled to the second conduction terminal of the enable transistor, the method comprising:
- applying a first voltage to the first conduction terminal of the enable transistor;
- applying a second voltage to the bulk terminal of the enable transistor, the second voltage being greater than or equal to the first voltage; and
- applying to the control terminal of the enable transistor a third voltage sufficient to turn on the enable transistor and thereby couple the first voltage to the control terminal of the memory cell.

17. The method of claim 16 wherein the enable transistor is a P-channel transistor.

18. The method of claim 16 wherein the step of applying a second voltage to the bulk includes electrically tying the bulk terminal to the first conduction terminal of the enable transistor.

* * * * *

UNITED STATES PATENT AND TRADEMARK OFFICE
CERTIFICATE OF CORRECTION

PATENT NO. : 6,381,173 B1
DATED : April 30, 2002
INVENTOR(S) : Nicola Zatelli

It is certified that error appears in the above-identified patent and that said Letters Patent is hereby corrected as shown below:

<u>Title page,</u>
Item [30], Foreign Application Priority Data Date should read as
-- October 12, 1999 --.

Signed and Sealed this

Twelfth Day of November, 2002

*Attest:*

JAMES E. ROGAN
*Attesting Officer*     *Director of the United States Patent and Trademark Office*